US007539466B2

United States Patent
Tan et al.

(10) Patent No.: US 7,539,466 B2
(45) Date of Patent: May 26, 2009

(54) AMPLIFIER WITH VARYING SUPPLY VOLTAGE AND INPUT ATTENUATION BASED UPON SUPPLY VOLTAGE

(75) Inventors: Geroncio O. Tan, Sunrise, FL (US); Timothy W. Heffield, Sunrise, FL (US); Gustavo D. Leizerovich, Aventura, FL (US); Danilo O. Tan, Pembroke Pines, FL (US)

(73) Assignee: Motorola, Inc., Schaumburg, IL (US)

( * ) Notice: Subject to any disclaimer, the term of this patent is extended or adjusted under 35 U.S.C. 154(b) by 518 days.

(21) Appl. No.: 11/011,579

(22) Filed: Dec. 14, 2004

(65) Prior Publication Data

US 2006/0128324 A1    Jun. 15, 2006

(51) Int. Cl.
*H04B 1/04* (2006.01)

(52) U.S. Cl. .................. 455/127.1; 455/13.4; 455/126; 330/149; 330/267; 330/285

(58) Field of Classification Search ............... 455/127.1
See application file for complete search history.

(56) References Cited

U.S. PATENT DOCUMENTS

| | | | |
|---|---|---|---|
| 5,119,040 A * | 6/1992 | Long et al. .................. 330/149 |
| 5,646,501 A * | 7/1997 | Fishman et al. ............. 320/112 |
| 6,091,934 A * | 7/2000 | Berman et al. ............. 455/13.4 |
| 6,529,716 B1 | 3/2003 | Eidson et al. |
| 6,681,101 B1 | 1/2004 | Eidson et al. |
| 2005/0242882 A1* | 11/2005 | Anderson .................... 330/285 |
| 2006/0226909 A1* | 10/2006 | Abedinpour et al. ........ 330/267 |

* cited by examiner

*Primary Examiner*—Yuwen Pan
*Assistant Examiner*—Ajibola Akinyemi
(74) *Attorney, Agent, or Firm*—Sylvia Chen; Fleit, Gibbons, Gutman, Bongini & Bianco P.L.

(57) ABSTRACT

A radio frequency amplifier module (500) has a voltage monitor (546) that monitors an input supply voltage of an input power supply (534) and an adjustable power supply (512) that accepts power from the input power supply (534) and produces an adjustable power supply output that has a controllable voltage. The radio frequency amplifier module (500) further has an amplifier (402) that is supplied by the adjustable power supply output and that amplifies a radio frequency signal. The radio frequency amplifier module (500) also has an output controller (546) that is communicatively coupled to the voltage monitor and the adjustable power supply (512). The output controller (546) controls, in response to the input source voltage, the controllable voltage of the adjustable power supply output.

19 Claims, 6 Drawing Sheets

AMPLIFIER WITH VARYING SUPPLY VOLTAGE AND INPUT ATTENUATION BASED UPON SUPPLY VOLTAGE

FIELD OF THE INVENTION

The present invention generally relates to the field of radio frequency amplifiers and more particularly relates to radio frequency amplifiers that are configurable to consume reduced supply of power.

BACKGROUND OF THE INVENTION

Communications equipment that is powered by a battery, such as cellular telephone subscriber units, is required to operate for as long as possible from a charged battery. Some radio frequency (RF) power amplifiers (PA) used in battery powered communications equipment are configured to operate with a power supply that produces an output voltage that dynamically tracks the envelope of the RF input signal to the RF PA. This results in the power supply output voltage tracking the envelope of the amplified RF signal at the output of the RF PA. Depending on the state of the reference input signal, the output of the power supply can be higher or lower than the battery voltage. In addition to envelope tracking, the peak envelope voltage of the power supply can alternatively be configured to track the average power of the RF PA. As the voltage supplied by a battery in such equipment drops, such as is caused by depletion of energy stored in the battery, the current demand by the power supply while producing a voltage higher than that produced by the battery will correspondingly increase. The output voltage of the battery is further reduced due to the increased current being passed through the internal battery resistance. The net effect of these factors is that a very large current peak by the radio frequency power amplifier causes battery monitoring circuits to determine that the battery voltage has dropped below an operating threshold, thereby triggering an early radio shutdown that leaves considerable energy in the battery.

Some radio frequency amplifiers, including radio frequency amplifiers used with time division, multiple access (TDMA) communications equipment, exhibit short periods with relatively high supply current peaks. These current peaks are exacerbated by the increased current demand caused by the constant voltage power supply. This increased current being drawn through the internal battery resistance can cause a large drop in the output voltage of the battery. Many battery operated communications equipment designs incorporate a battery monitor that will shut down the equipment, or at least the transmitter, when the battery voltage drops below a minimum operating level. Such high current spikes and the attendant decrease in battery output voltage can cause the radio to reset and on-going communications can be ungracefully terminated. A further problem is that the low battery output voltage can cause the voltage regulators that supply the radio frequency circuits, such as a VCO/Synthesizer, may no longer produce a regulated output and may cause the VCO to become unlocked and cause radio frequency signal splattering that could potentially violate radio frequency transmission regulations.

Therefore a need exists to overcome the problems with the prior art as discussed above.

SUMMARY OF THE INVENTION

Briefly, in accordance with the present invention, a radio frequency amplifier module has a voltage monitor that monitors an input supply voltage of an input power supply and an adjustable power supply that accepts power from the input power supply and produces an adjustable power supply output that has a controllable voltage. The radio frequency amplifier module further has an amplifier that is supplied by the adjustable power supply output and that amplifies a radio frequency signal. The radio frequency amplifier module also has an output controller that is communicatively coupled to the voltage monitor and the adjustable power supply. The output controller controls, in response to the input source voltage, the controllable voltage of the adjustable power supply.

Further in accordance with the present invention, a method for controlling an amplifier includes monitoring an input supply voltage of an input power supply and producing from the input power supply, an adjustable power supply output that has a controllable voltage. The method further includes amplifying a radio frequency signal with an amplifier supplied by the adjustable power supply output and controlling, in response to an input source voltage, the controllable voltage of the adjustable power supply output.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
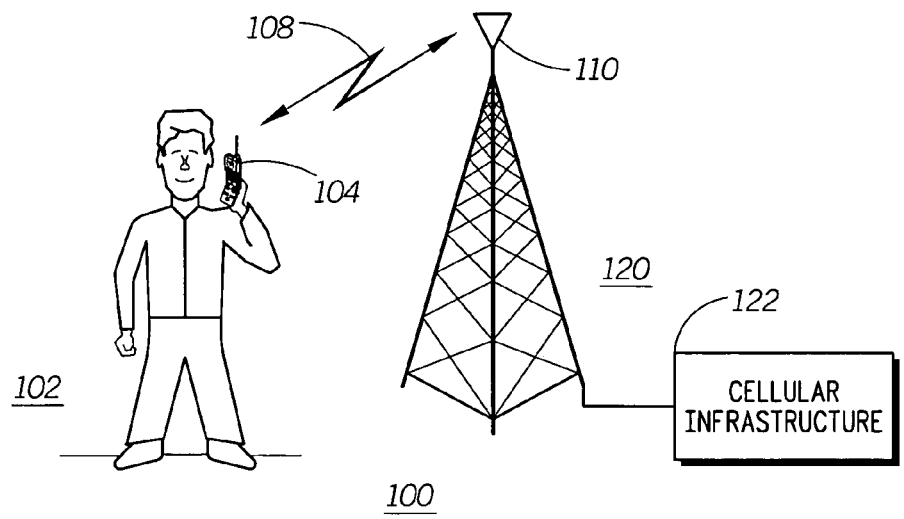
FIG. 1 illustrates a wireless communications environment that includes wireless devices according to an exemplary embodiment of the present invention.

FIG. 1 illustrates a wireless communications environment 100 that includes wireless devices according to an exemplary embodiment of the present invention. The exemplary wireless communications environment 100 shows a user 102 with a wireless communications device 104. The exemplary wireless communications environment 100 further includes a cellular system base station 120 that includes a base station antenna. The cellular system base station 120 is connected to a cellular infrastructure 122 that, in the exemplary embodiment, operates similarly to conventional cellular infrastructures.

The wireless communications device 104 is able to communicate with a cellular base station 120 over a base station wireless link 108. Communications with the wireless base station 120 is also to be performed by using bi-directional and/or simplex modes of communications, such as by the conventional techniques used in the exemplary embodiment.

Figure 2:
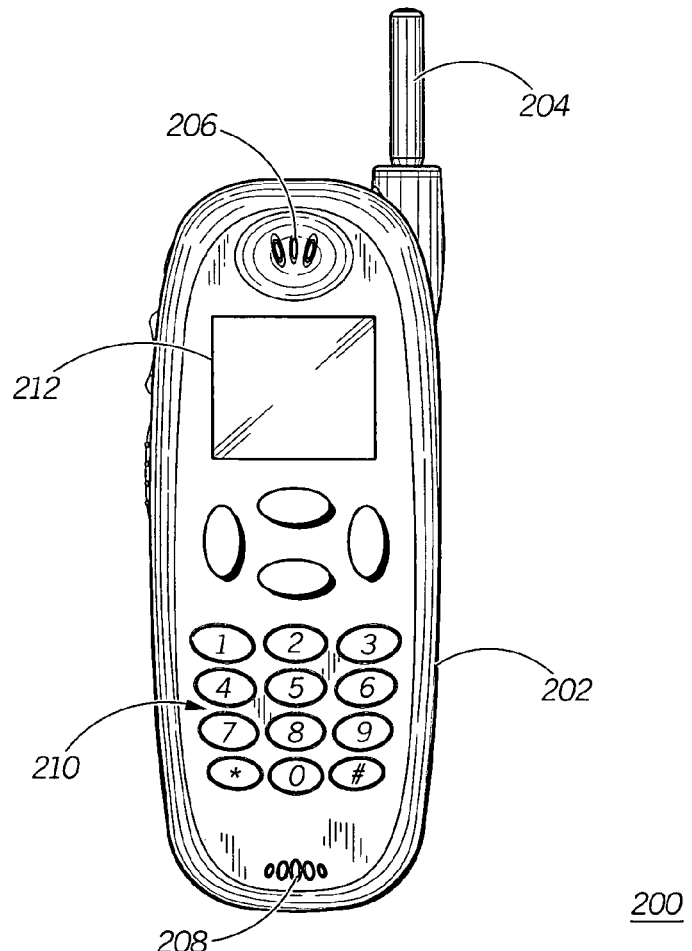
FIG. 2 illustrates a cellular phone that incorporates an exemplary embodiment of the present invention.

FIG. 2 illustrates a cellular phone 200 that incorporates an exemplary embodiment of the present invention. The exemplary cellular phone 200 includes a case 202 with several components. The exemplary cellular phone 200 has a display 212 that is able to display numeric and/or graphical information to the user. The exemplary cellular phone 200 further includes a keypad 210 that includes numeric keys and control keys as are commonly provided on cellular phones. The exemplary cellular phone 200 also has a speaker 206 and a microphone 208 to support voice communications over a wireless link. The exemplary cellular phone 200 further has a radio frequency signal antenna 204 used to transmit and receive wireless communications signals.

Figure 3:
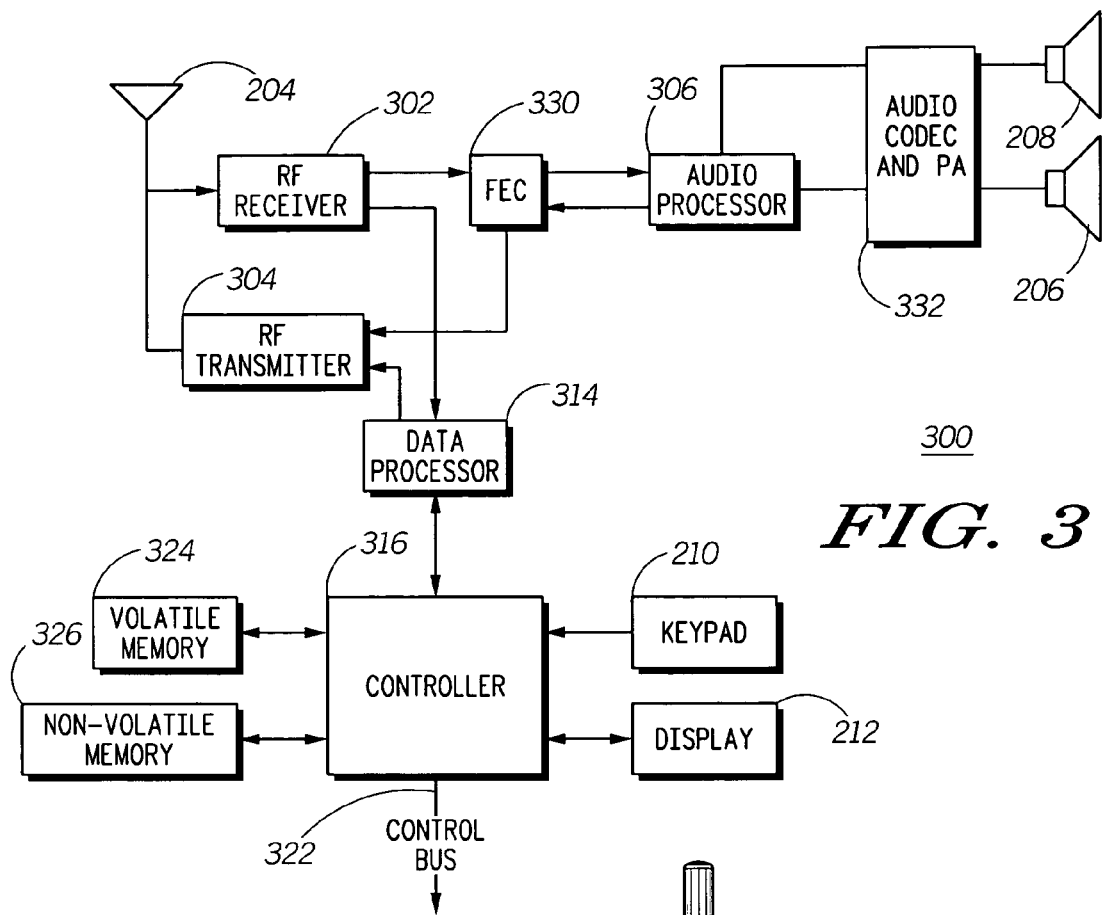
FIG. 3 illustrates a circuit block diagram for the exemplary cellular phone according to an exemplary embodiment of the present invention.

FIG. 3 illustrates a circuit block diagram 300 for the exemplary cellular phone 200 according to an embodiment of the present invention. The circuit block diagram illustrates the antenna 204 connected to an RF receiver 302 and an RF transmitter 304. The cellular phone 300 is able to simultaneously transmit and receive voice and/or data signals. The RF Transmitter 304 of the exemplary embodiment is able to include reprogrammable and/or reconfigurable logic circuits, including programmable processors, to implement the processing discussed below.

The RF receiver 302 and the RF transmitter 304 each connect to an audio processor 306 through a Forward Error Correction (FEC) processor 330 to provide and accept, respectively, audio signals to support simplex and/or duplex voice communications over a wireless link. FEC processor 330 provides improved bit error rate performance for wireless links over which the exemplary cellular phone 200 communicates. The audio processor 306 further accepts audio signals from and provides audio signals to an audio codec and power amplifier (PA) 332, which converts, conditions, and amplifies audio signals as required. The audio codec and power amplifier 332 accepts audio signals from microphone 208 and provides suitably conditioned and amplified audio signals to speaker 206 to support an audio interface with the user of the cellular phone 200.

The cellular phone block diagram 300 includes a controller 316 that controls the operation of the cellular phone in the exemplary embodiment. Controller 316 is connected to the various components of the cellular phone block diagram 300 via control bus 322. Controller 316 communicates data to external devices (not shown), such as a base station and/or a server, through a wireless link. Controller 316 provides data to and accepts data from data processor 314. Data processor 314 of the exemplary embodiment performs communications processing necessary to implement over-the-air data communications to and from external devices and includes a transmitter modem and a receive modem. Data processor 314 provides data for transmission to the RF transmitter 304 and accepts received data from RF receiver 302.

Controller 316 provides visual display data to the user through display 212. Display 212 of the exemplary embodiment is a Liquid Crystal Display that is able to display alphanumeric and graphical data. Controller 316 also accepts user input from keypad 210. Keypad 210 is similar to a conventional cellular phone keypad and has buttons to accept user input in order to support operation of the exemplary embodiment of the present invention.

The cellular phone block diagram 300 further includes non-volatile memory 326. Non-volatile memory 326 stores program data and more persistent data for use by the controller 316. Data stored in non-volatile memory 326 of the exemplary embodiment can be changed under control of controller 316 if called for by particular processing performed by the controller 316. The cellular phone block diagram 300 further contains volatile memory 324. Volatile memory 324 is able to store transient data for use by processing and/or calculations performed by the controller 316.

Figure 4:
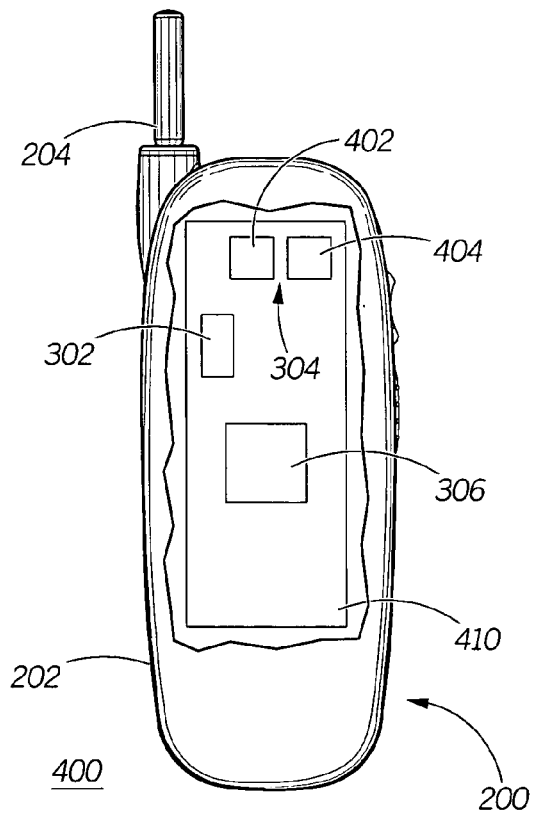
FIG. 4 illustrates a rear cut-away view for the exemplary cellular phone according to an exemplary embodiment of the present invention.

FIG. 4 illustrates a rear cut-away view 400 for the exemplary cellular phone 200 according to an exemplary embodiment of the present invention. Case 202 of the exemplary cellular phone 200 provides a mounting for the antenna 204 and contains a printed circuit board 410. The printed circuit board 410 of the exemplary embodiment supports a number of components and circuit mounted thereto. The printed circuit board 410 provides conductive interconnections between and among these components. Printed circuit board 410 includes the audio processor 306 described above. The printed circuit board 410 further includes circuits for the RF receiver 302. The printed circuit board 410 includes circuits that make up the RF transmitter 304, which include an RF signal modulator/generator 404 and an RF amplifier 402 in the example embodiment. The RF receiver 302 and RF amplifier 402 of the exemplary embodiment are connected to antenna 204 through circuitry and conductive connections contained on the printed circuit board 410 through conventional means that allow simultaneous transmission and reception by the RF transmitter 304 and RF receiver 302.

Figure 5:
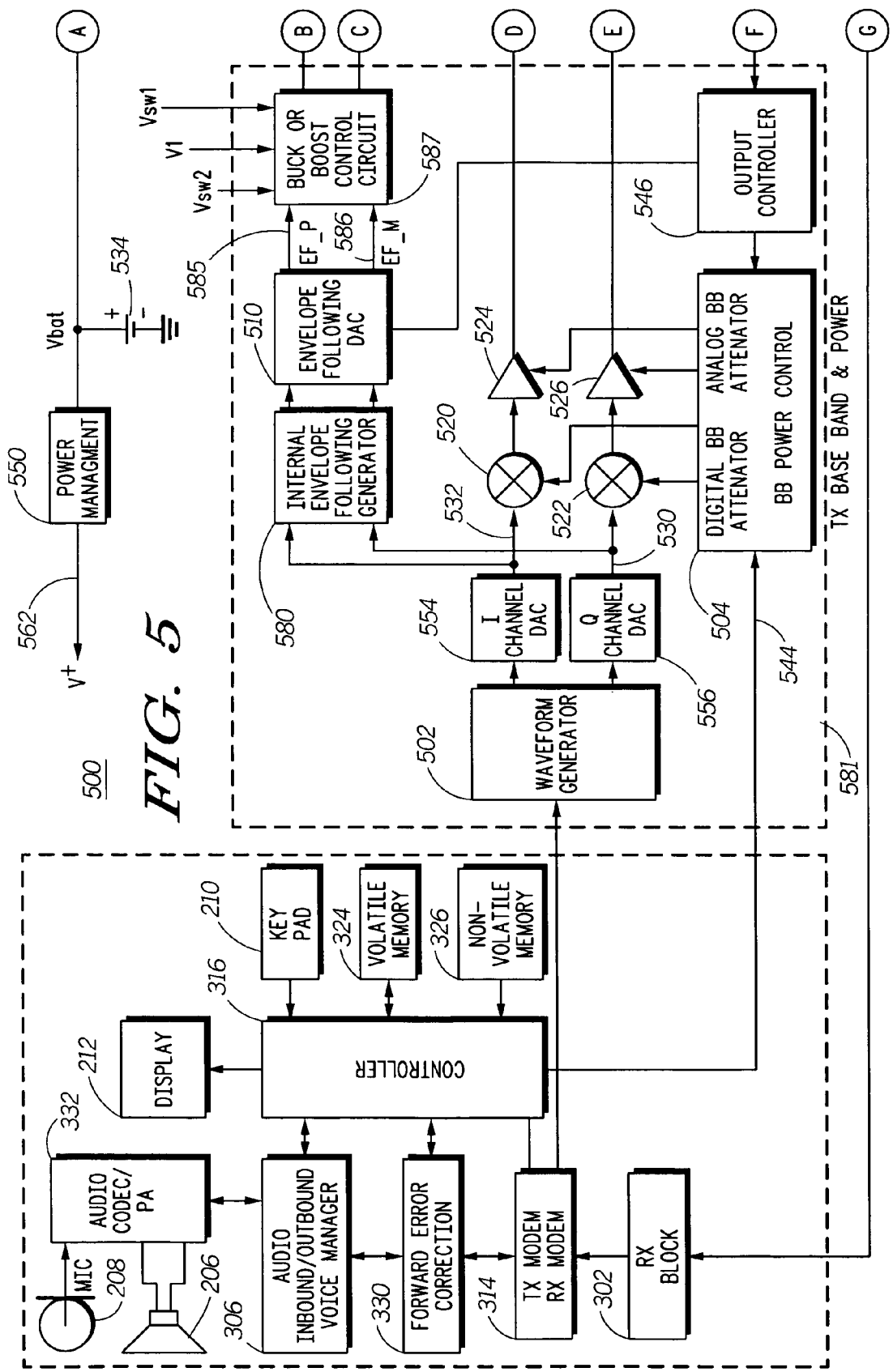
FIGS. 5 and 6 illustrate an RF transmitter chain according to an exemplary embodiment of the present invention.
Figure 6:
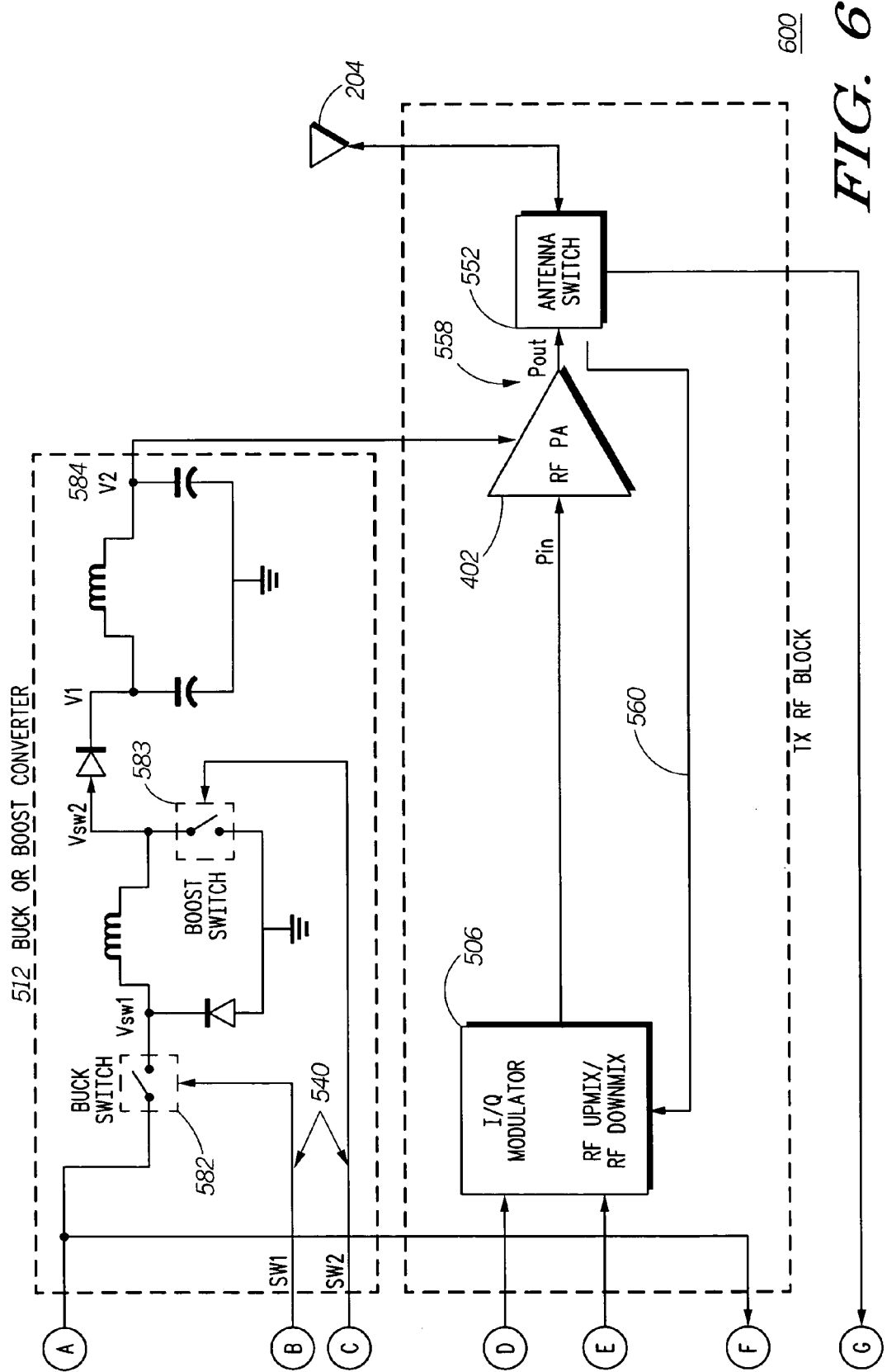

FIGS. 5 and 6 illustrate an RF transmitter chain 500 according to an exemplary embodiment of the present invention. The RF transmitter chain 500 illustrates a battery 534 and a power management processor 550 that provides power $V^+$ 562 to other circuits in the exemplary cellular phone 200. The RF transmitter chain 500 includes the antenna 204, the RF power amplifier 402, a transmitter base band and power module 581 and an I/Q modulator and RF up-mixer and down-mixer 506. The RF transmitter chain 500 further illustrates the RF receiver block 302, which receives RF energy from antenna 204 through an antenna switch 552. Sharing of the antenna 204 by the RF receiver 302 and RF power amplifier 402 is coordinated by antenna switch 552 in the exemplary embodiment.

The transmitter base band and power module 581 includes a waveform generator 502 that accepts a low bit sample rate data stream signal input from the transmitter modem that is part of data processor 314 and generates a complex baseband waveform. This complex baseband waveform is converted from a digital data stream to a pair of analog signals by the I channel Digital to Analog Converter (DAC) 554 and the Q channel Digital to Analog Converter (DAC) 556 to produce an In-phase (I) channel signal 532 and a Quadrature-phase (Q) channel signal 530. This complex baseband waveform is used to generate an RF signal to be transmitted by the RF antenna 204 as described below. The generated RF signal has a complex modulation which includes independently modulated amplitude and phase, as is known to ordinary practitioners in the relevant arts.

The I channel signal 532 and the Q channel signal 530 produced by the waveform generator 502 are each passed through an analog attenuator and a digital attenuator. The I channel 532 passes through the I digital baseband (BB) attenuator 520 and the I analog baseband attenuator 524. The Q channel 530 passes through the Q digital baseband (BB) attenuator 522 and the Q analog baseband attenuator 526. After attenuation, the complex baseband signal is provided to the I/Q modulator 506, which produces an RF signal that has the complex modulation specified by the data stream delivered by the I/Q modulator 506 to be transmitted over the wireless link. The RF output of the I/Q modulator 506 is provided to the RF power amplifier 402 and transmitted through antenna 204. The operation of the exemplary embodiment is able to vary the average power level of the RF signal to be transmitted by varying the attenuation provided by the analog and digital baseband attenuators.

The RF power amplifier 402 of the exemplary embodiment is configured to operate in a sufficiently linear amplification mode to support suitable amplification of the varying amplitude RF signal produced by the I/Q modulator 506, which is modulated in a Quadrature Amplitude Modulation (QAM) format in the exemplary embodiment. In addition to dynamically tracking the envelope of the RF signal, further reduction in power consumption by the RF power amplifier 402 is achieved by adjusting the peak voltage level of the supply voltage supplying the RF power amplifier to maintain operation of the RF power amplifier near its 1 dB to 1.5 dB compression point during data peaks whenever the desired output power is lower than the maximum power. An example of such a condition is power cutback due to strong transmitted signal conditions.

The supply voltage level provided to the RF power amplifier 402 in the exemplary embodiment is adjusted according to the envelope of the RF signal to be amplified. The operation of the exemplary embodiment computes an approximation of the envelope of the baseband signal generated by the waveform generator 502, which corresponds to the envelope of the RF signal to be amplified, and adjusts the voltage level of the power supply that provides power to the RF power amplifier 402 in order to cause the RF power amplifier 402 to operate at a desired amplification compression point, such as sufficiently near the 1 dB to 1.5 dB compression point for the power amplifier 402 of the exemplary embodiment. The power supply voltage, $V_{SW}$, provided to the RF power amplifier 402 of the exemplary embodiment is based upon the sum of squares of the value of the I and Q channel baseband signals, represented as i and q. The envelope is then used to determine a power supply voltage to provide to RF power amplifier 402 according to the following power amplifier supply voltage equation:

$$V_{SW} = a_0 + a_1 x + a_2 x^2$$

where $x = i^2 + q^2$

In order to determine the envelope of the baseband signal to be transmitted, the I channel signal 532 and the Q channel signal 530 are provided to the envelope following generator 580. The envelope following generator converts the I channel signal 532 and the Q channel signal 530 into the sum of squares and determines a power supply voltage to provide to RF power amplifier 402 according to the equation given above. The coefficients $a_0$, $a_1$, & $a_2$, discussed above, are adjusted in the exemplary embodiment during transmission operations to manipulate the resulting power supply voltage so as to cause, for example, a deviation from the ideal power supply voltage in order to add margins to accommodate for system delays and to provide a DC offset to prevent the RF power amplifier from turning off during zero crossings of the RF envelope.

The coefficients $a_0$, $a_1$, and $a_2$, are empirically determined for an exemplary product during a product's development and these empirically determined coefficients are programmed into all copies of that product that are produced. These coefficients are adjusted by the operation of the exemplary embodiment of the present invention during the operation of the RF transmitter chain 500 to reduce the power supply voltage $V_{SW}$ to the RF power amplifier 402 based upon system power control due to signal condition, as well as power cutback due to the output voltage of the battery 534. The exemplary embodiment stores a set of pre-determined coefficients $a_0$, $a_1$, and $a_2$ for the envelope following generator 580 in a table. This table of coefficients contains one entry, with an associated index, that is a set of the coefficients $a_0$, $a_1$, and $a_2$ for each level of power supply voltage reduction, and associated RF output power reduction to be applied to the RF power amplifier 402. An index is assigned to each level of RF output power cutback from the maximum RF output power level for the RF PA. The entries of this table in the exemplary embodiment define coefficients $a_0$, $a_1$, and $a_2$, for power supply voltage reductions that correspond to 0.1 dB RF output power reduction steps. This table is used for all transmitters of a given design. Each particular transmitter undergoes calibration testing, such as during manufacturing or recalibration in the exemplary embodiment, in order to configure the transmitter to use a particular index into this table, and the corresponding coefficients $a_0$, $a_1$, and $a_2$, that are the subset of pre-determined parameters for the exemplary embodiment, when producing maximum RF output power. The index configured into each transmitter is referred to as the "Envelope_Tuned" index and compensates for component variations in each transmitter. This index is determined and stored in each transmitter for a number of RF frequencies in order to optimize performance across the RF band for the individual transmitters. The calibration processing used during production of the transmitters of the exemplary embodiment to determine the index of the Envelope_Tuned value for various frequencies is described below. In order to reduce the power supply voltage delivered to the RF power amplifier 402, the operation of the exemplary embodiment retrieves entries from the table of coefficients that are offset from the Envelope_tuned entry.

The output of the envelope following generator 580 is provided to an envelope digital to analog converter (DAC) 510 that converts the output signal from the envelop following generator 580 into a differential analog signal labeled EF_P 585 and EF_M 586, which correspond to the positive and negative polarity of this differential analog signal. The differential output of the envelope DAC 510 represents the envelope of the baseband signal and is provided as a reference input to a "Buck or Boost" (B.O.B.) control circuit 587. The Buck or Boost control circuit 587 in turn controls the Buck or Boost converter circuit 512 via the Buck switch 582 and the Boost switch 583 and associated passive filtering and conditioning components. The B.O.B. circuit 512 is a power supply conditioning circuit that accepts a power supply voltage, such as via a power connection to the battery 534 of the exemplary cellular phone 200. The B.O.B. circuit 512 operates in response to the control inputs to deliver a power supply voltage that is either dynamically reduced or increased relative to the input power supply voltage provided by battery 534. The control input, which controls the output voltage produced by the B.O.B. circuit 512 of the exemplary embodiment, is influenced by the magnitude of the baseband signal envelope, system power control, and the output voltage of battery 534, as determined by the above described processing of the envelope following generator 580 and envelope following DAC 510.

The B.O.B. circuit 512 of the exemplary embodiment is a combination commutating voltage reduction circuit and an inductive voltage multiplier that is able to either reduce or increase in input power supply voltage according to a control input. The B.O.B. circuit 512 of the exemplary embodiment accepts a control input that corresponds to an output power supply voltage to be provided by the B.O.B. circuit 512 and that voltage is provided regardless of the voltage level of the current power supply input to the B.O.B. circuit 512. Details of the B.O.B. circuit 512 of the exemplary embodiment are described in detail in U.S. Pat. No. 6,348,781. The entire teachings and content of U.S. Pat. No. 6,348,781 are hereby explicitly incorporated herein by reference. This adjusted power supply voltage $V_2$ 584 produced at the output of the B.O.B. circuit 512 is provided to the RF power amplifier 402.

The RF transmitter chain 500 of the exemplary embodiment further contains an output controller 546 that monitors the output voltage level of the battery 534 and provides control signals to reduce 1) the supply voltage provided to the RF PA 402; and 2) reduce the magnitude of the baseband signal in order to reduce transmitted RF power. The output controller 546 of the exemplary embodiment provides control signals to the envelope following generator 580 by altering the coefficients to the power amplifier supply voltage equation, i.e., the coefficients $a_0$, $a_1$, and $a_2$, given above. The output controller 546 further provides control signals to the baseband power control 504 to cause increased attenuation for the baseband signal so as to cause a reduced transmitted RF power output to be output by the RF power amplifier 402.

The output controller 546 of the exemplary embodiment monitors the output voltage of battery 534 and has different modes of RF signal attenuation based upon which of three voltage ranges the output voltage of the battery 534 falls. The output controller 546 determines into which of those three voltage regions the output voltage of battery 534 falls. A first region includes output voltages for the battery 534 that are greater than a first threshold, which is about 50% of full battery voltage in the exemplary embodiment. There is no RF signal attenuation or reduction in the power supply voltage that is delivered to the RF power amplifier for battery output voltages in this first region. A second region includes output voltages for the battery 534 that are less than a second threshold, which is about 30% of full battery voltage in the exemplary embodiment. A constant signal attenuation of approximately 2 dB is applied to the baseband signal in this second region. This constant attenuation is in addition to other RF transmitted RF signal power controls implemented by the transmitter, such as for conventional transmit power management to minimize interference in cellular networks. A third region includes output voltages for the battery 534 that are less than the first threshold and greater than second threshold. A linear reduction in RF output transmission power is applied in this third region so that the RF output transmission power is reduced linearly according to values of output voltages of the battery 534 that are between the first threshold and the second threshold. In addition to these reduced RF output transmission power levels, the exemplary embodiment further adjusts the coefficients of the power amplifier supply voltage equation, described above to reduce power supply voltage to RF power amplifier 402. These coefficients are adjusted by the envelope following generator 580 in response to control inputs from the output controller 546.

The operation of the RF transmitter chain 500 reduces power consumption when the output voltage of the battery 534 drops. The operation of the RF transmitter chain 500 is especially beneficial because as energy is consumed from the battery 534 and the battery output voltage drops, the internal resistance of the battery also increases. As the current drawn by the B.O.B. circuit 512 increases due to the reduced battery output voltage, the internal resistance of the battery 534 further reduces the output voltage of the battery under such increased current drain conditions. This can cause battery monitoring circuits to determine that the battery voltage has dropped below operational thresholds and halt operation of the RF transmitter chain 500 and/or the entire portable communications device.

An additional characteristic of the operation of the RF transmitter chain 500 involves periodic amplitude training of the RF power amplifier 402 in the exemplary embodiment. As discussed above, the RF transmitter chain 500 transmits a Quadrature Amplitude Modulated (QAM) signal that has varying amplitude. This requires a substantially linear operation of the RF power amplifier 402. In order to maintain this substantially linear operation, periodic amplitude training is performed to determine the input to output power compression point of the RF power amplifier 402. The amplitude training process of the exemplary embodiment ramps up the level of the RF input power being provided into the RF power amplifier 402 and monitors at which output power level the output power of the RF power amplifier does not increase at the same rate. The monitoring of output power levels in the exemplary embodiment is performed by the I/Q modulator 506 by down-mixing and processing an output RF sample 560. The output RF sample 560 is a coupled RF signal with a power level that is a known fraction of the output of the RF power amplifier 402. The output RF sample 560 is obtained by RF coupler 558 in the exemplary embodiment. This operation can cause high current demand by the RF power amplifier 402 and the B.O.B. circuit 512 providing power to the RF power amplifier 402. The increased current demand is exacerbated by the higher internal resistance of a partially discharged battery so as to further reduce the battery output voltage and increase the current demand of the B.O.B. circuit 512. This can cause excessive energy consumption and reduction in battery life.

Figure 7:
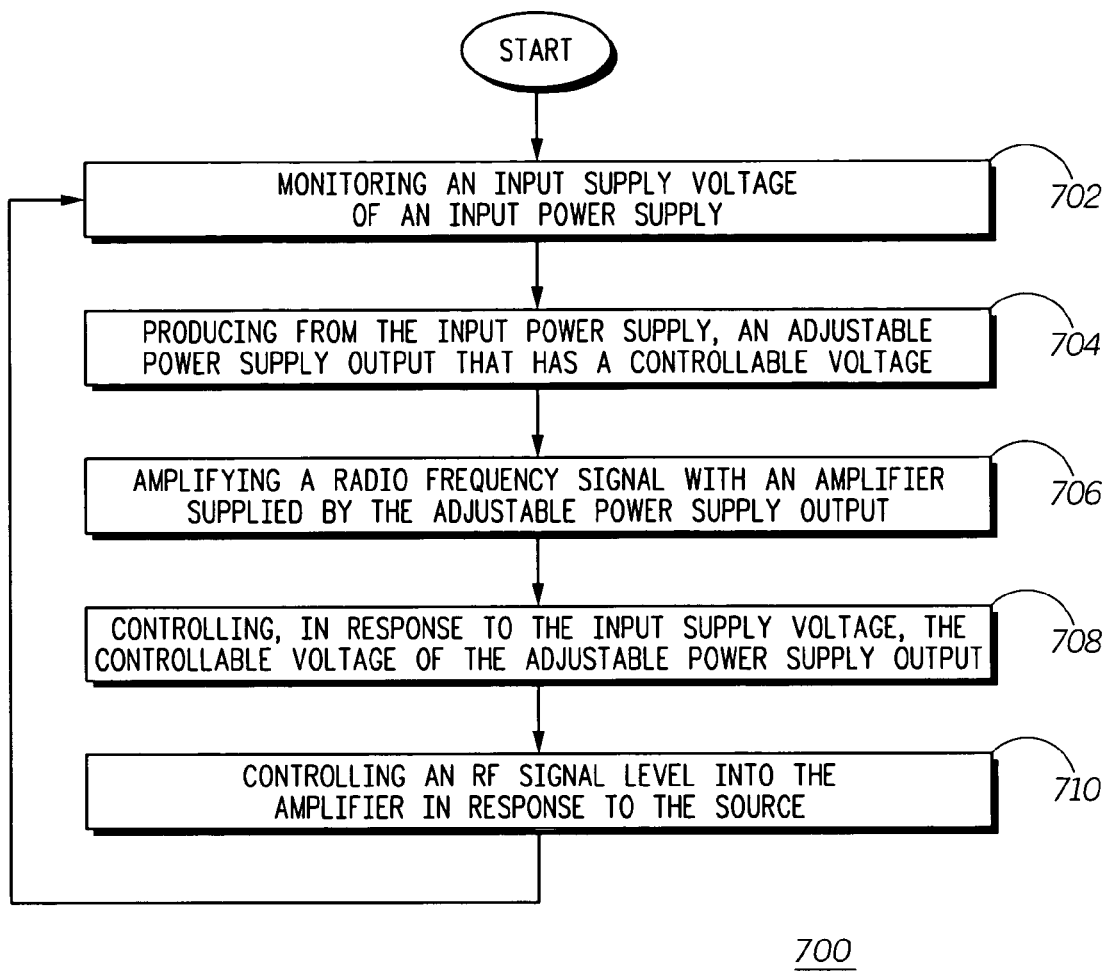
FIG. 7 illustrates a processing flow diagram for controlling supply voltage and RF drive according to an exemplary embodiment of the present invention.

FIG. 7 illustrates a processing flow diagram for controlling supply voltage and RF drive 700 according to an exemplary embodiment of the present invention. The processing flow for controlling supply voltage and RF drive 700 begins by monitoring, at step 702, an input supply voltage of an input power supply. In the exemplary embodiment, this input power supply corresponds to battery 534. The processing of the exemplary embodiment next continues by producing from the input power supply, at step 704, an adjustable power supply output that has a controllable voltage. In the exemplary embodiment of the present invention, the adjustable power supply output is produced by the B.O.B. circuit 512. The processing continues by amplifying, at step 706, a radio frequency signal with an amplifier supplied by the adjustable power supply output. This amplifier corresponds to the RF amplifier 402 in the exemplary embodiment. The processing then controls, at step 708 and in response to the input supply voltage, the controllable voltage of the adjustable power supply output.

The processing next controls, at step 710, an RF signal level into the amplifier in response to the source. These two controls are performed by the output controller 542 and implemented with control signals communicated to the envelope following generator 580 and the baseband power control 504 according to the algorithms described above. This processing then returns to monitoring, at step 702, an input supply voltage of the input power supply and continues processing while the transmitter is operating.

The RF transmitter chain 500 can achieve further efficiencies by limiting the maximum voltage that is provided to the RF power amplifier 402 so as to ensure that the RF power amplifier is operating at approximately its 1 dB compression point at the specified maximum output power or at the specified maximum output power with a power margin. This maximum voltage is then used as a basis to calculate voltage reductions of the supply voltage provided to the RF power amplifier 402 as a result of reduced battery voltage.

Figure 8:
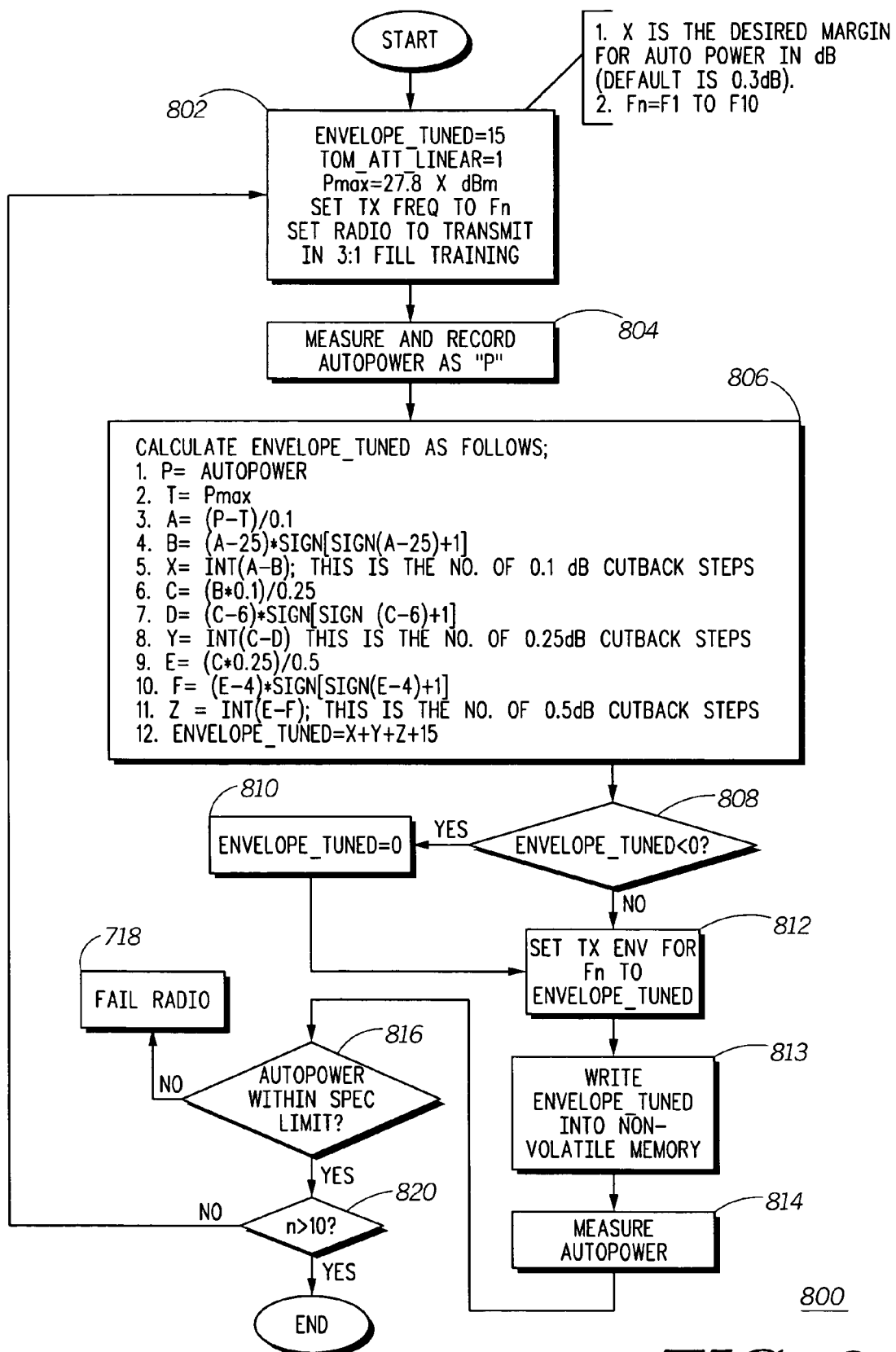
FIG. 8 illustrates a calibration processing flow diagram used to determine coefficients that set the maximum power supply voltage for the RF power amplifier in accordance with an exemplary embodiment of the present invention.

FIG. 8 illustrates a calibration processing flow diagram 800 used to determine coefficients that set the maximum power supply voltage for the RF power amplifier 402 in accordance with an exemplary embodiment of the present invention. This processing flow is performed during calibration processing, such as during unit manufacture or periodic maintenance, to determine the entry of the table of coefficients, i.e., the coefficients $a_0$, $a_1$, and $a_2$ discussed above, to be selected for the particular transmitter being processed. This determined entry is the maximum table entry to be used for this transmitter, and this transmitter will only use the coefficients at and below this entry in the table. Limiting the maximum table entry in this manner forms a subset of pre-determined parameters that is selected to cause the amplifier to operate at a specified RF output level relative to a specified RF output power compression point. The specified RF output power produced at the specified RF output power compression point is set by the "autopower" value described above, and is selected so that the maximum power supply voltage delivered to the RF power amplifier 402 causes the RF power amplifier 402 to produce an RF output power level that is a pre-determined margin above the maximum rated output power for the transmitter. In this example, the maximum rated output power is 27.8 dBm and the margin is 0.3 dBm. The calibration processing therefore results in determining the power supply voltage to be provided to the RF amplifier 402 when its output is at a specified level which is 28.1 dBm in this example.

The processing flow begins by setting, at step 802, initial values for processing parameters. Vsw, represented by Envelope_Tuned, is set to a level such that at this level, the PA puts out 1.5 dB lower power than its maximum output level when Vsw is at its maximum level. The exemplary embodiment stores values of coefficients $a_0$, $a_1$, and $a_2$, for desired RF output levels in 0.1 dB increments, so a value of 15 corresponds to retrieving the values for a 1.5 dB output power reduction. This is indicated by the value of "Envelope_Tuned=15 in the exemplary embodiment. A maximum envelope voltage that corresponds to an output RF power level that is 1.5 dB below the maximum value is selected as the starting point in the exemplary embodiment due to an observation that when operating at the maximum envelope voltage, RF power amplifiers 402 of some production units may produce excessive output power during amplitude training. Producing such excessive output power leads to a peak current draw from the battery 534 during the amplitude training process of operations to also be excessive, which can create a sufficiently large voltage drop at the battery 534 to cause the radio to shut down due to the battery voltage dropping below the end of battery life voltage trigger point, as detected by the power management module 550 of the exemplary embodiment.

The initial value for Pmax is set to a level slightly higher than the maximum rated output power of the transmitter, which is 28.1 dBm, as is described above. The calibration processing 800 is iterated for ten RF frequencies in the exemplary embodiment. These ten RF frequencies are identified by the values stored in F1 through F10, which is generically referred to as Fn in this description. The transmit frequency is set to F1 for the initial iteration of this step.

The value TOM_ATT_LINEAR is the baseband attenuator setting. The term 3:1 Full training refers to amplitude training with a 3:1 TDM interleave, i.e., with a 33% duty cycle. In this description, the 3:1 Full training is generalized as "Amplitude Training"

By setting the envelope voltage to 1.5 dB below its maximum possible value, and the baseband attenuators, i.e., I digital baseband attenuator 520, I analog baseband attenuator 524, Q digital baseband attenuator 522, and the Q analog baseband attenuator 526, to their minimum attenuation setting; an RF signal with a linear power ramp is provided as an input to the RF PA 402. The amplified output that is generated as the input RF signal is ramped is then compared to the input signal by the I/Q Modulator RF upmix/RF Downmix 506 to produce an error voltage that corresponds to the output RF power compression for the current RF power output level of the RF power amplifier 402. When the error voltage that corresponds to the power amplification compression exceeds a preset threshold, the ramp is terminated and the input RF power level to the RF power amplifier 402 at which the error voltage threshold is exceeded is recorded and stored in the radio being processed by the calibration processing. In the exemplary embodiment, the threshold for the error voltage is selected to correspond to a 3 dB RF output power compression point for the RF power amplifier 402. The operation of the exemplary embodiment scales the RF magnitude of subsequent data transmissions via operation of the baseband attenuators, i.e., I digital baseband attenuator 520, I analog baseband attenuator 524, Q digital baseband attenuator 522, and the Q analog baseband attenuator 526, to ensure that data peaks do not exceed the stored input RF power level that corresponds to the specified amplifier compression ratio. The RF output power at which the error voltage exceeds the threshold described above is referred to as "Auto Power" for that particular transmitter.

The processing then measures and records, at step 804, the power produced by the power amplifier. The measured value is stored in the variable "P." The processing then continues by calculating envelope_tuned parameter.

The production process for the exemplary embodiment tunes the peak envelope voltage to be used for each transmitter over several frequencies across the operating bandwidth during production in order to overcome the scenario described above. A set of pre-determined coefficients for the envelope following generator 580 is stored in the exemplary embodiment. An index is assigned to each level of RF output power cutback from the maximum RF output power level for the RF power amplifier 402. Each transmitter is then configured to use a particular index, referred to as the "Envelope_Tuned" index, that corresponds to the level of cutback to be used by that particular transmitter for several frequencies across the RF band in which the transmitter operates. The Envelope_Tuned value is calculated as shown for step 806.

The goal for calibrating the Envelope_Tuned index is to limit the maximum output of the RF power amplifier 402 to a desired level by limiting the maximum DC voltage available to the RF power amplifier 402. The operation of the exemplary embodiment achieves further efficiency improvements by optimizing the headroom for each production RF power amplifier. This calibration algorithm starts by setting the initial value of Vsw to a level that causes the RF power amplifier 402 to operate at 1.5 dB lower than its maximum output power level. The algorithm then measures the autopower value and Vsw is adjusted by changing the value of envelope_tuned to the corresponding index that causes the RF power amplifier 402 output to match the level specified by Pmax.

The calculation of the envelope_tuned value, at step 806, begins by setting a variable "P" to the autopower value that was recorded above in step 804. The processing then sets a variable "T" to the value of Pmax, which is the maximum RF output power to be produced by the transmitter. The processing then calculates the difference between the measured AutoPower "P" and the target "Pmax" and converts the result into number of 0.1 dB step and stores it into the variable "A."

In the exemplary embodiment, the coefficient table has entries that cover a range of 6 dB. In order to conserve memory space in the exemplary embodiment used to store the coefficients for each level, the coefficients are stored in 0.1 dB steps for only the first 2.5 dB. From 2.5 dB to 4 dB, the steps are increased to 0.25 dB per step and 0.5 dB per step from 4 to 6 dB. The calibration processing flow converts the number of 0.1 dB steps obtained in Step 3 into the proper Envelope_Tuned index value.

The processing then sets the "B" variable equal to a value determined by subtracting 25 from "A" variable and multiplying that quantity by the sign of the quantity of one plus the sign of the quantity of "A" less 25. The processing next sets the value of the "X" variable equal, which holds the number of 0.1 dB steps available, to the integer value of the difference between and "A" and the "B" variables, which were determined above. The processing next sets the variable "C" to a value equal to 0.4 times the value stored in the variable "B" which was calculated above. The processing then sets the variable "D" equal to the quantity of (C-6) times the sign of the quantity of one plus the sign of the quantity of "A" less 6. The processing then sets the "Y" variable equal to the integer value of the difference between the "C" and the "D" variables, calculated above. The processing next sets the "E" variable equal to one half of the value of the "C" variable. The processing next sets the "F" variable to the value of the "E" variable less four times the sign of the quantity if one plus the sign of the quantity of "E" less four. The processing then sets the "Z" variable to the integer value of the difference between the "E" variable and the "F" variable, which were calculated above. The processing then sets the "Envelope_tuned" value to the sum of the "X," "Y," and "Z" variables plus 15.

The processing next determines, at step 808, if the above calculated envelope_tuned parameter is less than zero. If the envelope_tuned parameter is less than zero, which signifies that the index into the stored coefficient table was determined to be an impermissible value, the processing sets, at step 810, the envelope_tuned parameter to zero. The processing of the exemplary embodiment next sets, at step 812, the TX_ENV value that is associated with the current RF frequency to the value of the envelope_tuned parameter. The processing then measures, at step 814, the autopower parameter and determines, at step 816, if the autopower parameter is between 28.2 and 28.1 dBm, which is the specified maximum output power for the RF transmitter of the exemplary embodiment. If the measured autopower is not within the prescribe range, the transmitter is indicated as failed, at step 818, because it does not produce the required RF output power level. If the autopower parameter is within this range, the processing next determines, at step 820, if all RF frequencies have been calibrated. The processing of the exemplary embodiment calibrates the transmitters at ten specified frequencies, identified by Fn with n between 1 and 10. If the number "n" is not greater than or equal to ten, the processing returns to setting, at step 802, the initial parameters for the next RF frequency to use for the calibration processing, which includes incrementing the value of "n." If the value of "n" is greater than or equal to ten, the calibration processing terminates.

The present invention can be realized in hardware, software, or a combination of hardware and software. A system according to an exemplary embodiment of the present invention can be realized in a centralized fashion in one computer system or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least one computer readable medium that allows the computer to read data, instructions, messages or message packets, and other computer readable information. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A radio frequency amplifier module, comprising:
 a voltage monitor that monitors an input supply voltage of an input power supply;
 an adjustable attenuator that attenuates an input signal used to produce a radio frequency signal, the radio frequency signal having a time varying power envelope;
 an adjustable power supply that produces, from the input power supply, an adjustable power supply output that has a controllable voltage;
 an amplifier, supplied by the adjustable power supply output, that linearly amplifies a radio frequency signal, the amplifier producing an amplified radio frequency signal having an output power level; and an output controller, communicatively coupled to the voltage monitor, the adjustable attenuator, and the adjustable power supply, wherein the output controller determines, based on a level of the input supply voltage, a reduced power level that is a difference between a desired radio frequency output power level and a power cutback level, the power cutback level being based upon the level of the input supply voltage, and adjusts, in response to the level of the input supply voltage, the output power level of the amplified radio frequency signal to the reduced power level by adjusting the adjustable attenuator and by adjusting the controllable voltage of the adjustable power supply output to an adjusted voltage so as to cause the amplifier to linearly operate at the reduced power level that is substantially at a pre-determined output power compression level.

2. The radio frequency amplifier of claim 1, wherein the adjustable power supply comprises a buck or boost circuit.

3. The radio frequency amplifier of claim 1, further comprising a signal envelope monitor, communicatively coupled to the voltage monitor and the output controller, that monitors a power envelope of the input signal and wherein the output controller further adjusts, in response to the power envelope and the level of the input supply voltage, the output power level of the amplified radio frequency signal so as to cause the amplifier to linearly operate at the reduced power level that is substantially at a pre-determined output power compression level.

4. The radio frequency amplifier of claim 3, wherein the output controller comprises a plurality of pre-determined parameters of an equation that defines the adjusted voltage based upon the power envelope, the plurality of pre-determined parameters comprising respective parameters for each of a plurality of power cutback levels.

5. The radio frequency amplifier of claim 4, wherein a subset of the pre-determined parameters is selected based upon measurements made during recurring calibration processing.

6. The radio frequency amplifier of claim 1, wherein the output controller has an upper input supply voltage threshold and a lower input supply voltage threshold, wherein the power cutback level is defined to be a pre-defined constant for levels of input supply voltages that are below the lower input supply voltage threshold and the power cutback level is defined to be linearly decreasing from zero to the pre-defined constant for levels of input supply voltages between the upper input supply voltage threshold and the lower input supply voltage threshold.

7. The radio frequency amplifier of claim 4, the output controller comprising a plurality of pre-determined transfer parameters based upon a design of the amplifier, the plurality of predetermined transfer parameters defining coefficients of the equation that defines the adjusted voltage, and wherein the plurality of pre-determined parameters are a subset of the set of pre-determined transfer parameters, the subset being selected during a recurring calibration process.

8. The radio frequency amplifier of claim 6, wherein the output controller adjusts the controllable voltage of the adjustable power supply output so as to cause the amplifier to operate at the reduced power level that is substantially at a pre-determined output power compression level by selecting one of the plurality of pre-determined parameters within the plurality of pre-defined parameters.

9. A method for controlling an amplifier, the method comprising:

monitoring an input supply voltage of an input power supply;

producing, from the input power supply, an adjustable power supply output that has a controllable voltage;

linearly amplifying a radio frequency signal with an amplifier supplied by the adjustable power supply output to produce an amplified radio frequency signal having an output power level, the radio frequency signal having a time varying power envelope;

determining, based on a level of the input supply voltage, a reduced power level that is a difference between a desired radio frequency output power level and a power cutback level, the power cutback level being based upon the level of the input supply voltage, and adjusting, in response to the level of the input source supply voltage, the output power level of the amplified radio frequency signal to the reduced power level, the adjusting comprising:

adjusting an adjustable attenuator that attenuates an input signal used to produce the radio frequency signal; and adjusting the controllable voltage of the adjustable power supply output to an adjusted voltage so as to cause the amplifier to linearly operate at the reduced power level that is substantially at a pre-determined output power compression level.

10. The method of claim 9, wherein the adjustable power supply comprises a buck or boost circuit.

11. The method of claim 9, further comprising monitoring a power envelope of the input signal, the method further comprising:

adjusting, in response to the power envelope and the level of the input supply voltage, the output power level of the amplified radio frequency signal so as to cause the amplifier to linearly operate at the reduced power level that is substantially at a pre-determined output power compression level.

12. The method of claim 11, wherein the adjusted voltage is determined based upon a plurality of pre-determined parameters of an equation that defines the controllable voltage of the adjustable power supply output to provide to the amplifier based upon the power envelope, the plurality of pre-determined parameters comprising respective parameters for each of a plurality of power cutback levels.

13. The method of claim 12, wherein the plurality of pre-determined transfer parameters defining coefficients of the equation that defines the controllable voltage are a subset of a set of pre-determined transfer parameters stored in a device and that are based upon a design of the amplifier, the subset being selected during a recurring calibration process.

14. The method of claim 9, further comprising:

comparing the level of the input supply voltage to an upper input supply voltage threshold and a lower input supply voltage threshold, wherein the power cutback level is defined to be a pre-defined constant for levels of input supply voltages that are below the lower input supply voltage threshold and the power cutback level is defined to be linearly decreasing from zero to the pre-defined constant for levels of input supply voltages between the upper input supply voltage threshold and the lower input supply voltage threshold.

15. The method of claim 12, wherein adjusting the controllable voltage of the adjustable power supply output so as to cause the amplifier to operate at the reduced power level that is substantially at a pre-determined output power compression level comprises selecting one of the plurality of pre-determined parameters within the plurality of pre-defined parameters.

16. A computer program product for controlling an amplifier, the computer program product comprising:
- a machine readable medium storing machine readable instructions adapted to be read and executed by a processing circuit for performing a method comrprising:
- monitoring an input supply voltage of an input power supply;
- producing, from the input power supply, an adjustable power supply output that has a controllable voltage;
- linearly amplifying a radio frequency signal with an amplifier supplied by the adjustable power supply output to produce an amplified radio frequency signal having an output power level, the radio frequency signal having a time varying power envelope;
- determining, based on a level of the input supply voltage, a reduced power level that is a difference between a desired radio frequency output power level and a power cutback level, the power cutback level being based upon the level of the input supply voltage, and
- adjusting, in response to the level of the input source supply voltage, the output power level of the amplified radio frequency signal to the reduced power level, the adjusting comprising:
  - adjusting an adjustable attenuator that attenuates an input signal used to produce the radio frequency signal; and
  - adjusting the controllable voltage of the adjustable power supply output to an adjusted voltage so as to cause the amplifier to linearly operate at the reduced power level that is substantially at a pre-determined output power compression level.

17. A wireless communication device, comprising:
- an antenna;
- an input power supply;
- a circuit supporting substrate; and
- a radio frequency amplifier circuit disposed on the circuit supporting substrate and electrically coupled to the antenna, and wherein the radio frequency amplifier circuit comprising:
  - a voltage monitor that monitors an input supply voltage of an input power supply;
  - an adjustable attenuator that attenuates an input signal used to produce a radio frequency signal, the radio frequency signal having a time varying power envelope;
  - an adjustable power supply that produces, from the input power supply, an adjustable power supply output that has a controllable voltage;
  - an amplifier, supplied by the adjustable power supply output, that linearly amplifies a radio frequency signal, the amplifier producing an amplified radio frequency signal having an output power level; and
  - an output controller, communicatively coupled to the voltage monitor, the adjustable attenuator, and the adjustable power supply, wherein the output controller
    - determines, based on a level of the input supply voltage, a reduced power level that is a difference between a desired radio frequency output power level and a power cutback level, the power cutback level being based upon the level of the input supply voltage, and
    - adjusts, in response to the level of the input supply voltage, the output power level of the amplified radio frequency signal to the reduced power level by adjusting the adjustable attenuator and by adjusting the controllable voltage of the adjustable power supply output to an adjusted voltage so as to cause the amplifier to linearly operate at the reduced power level that is substantially at a pre-determined output power compression level.

18. The wireless communication device of claim 17, wherein the adjustable power supply comprises a buck or boost circuit.

19. The wireless communication device of claim 17, further comprising a signal envelope monitor that monitors a power envelope of the input signal and wherein the output controller controls the adjustable attenuator in response to the power envelope to substantially operate the radio frequency amplifier circuit at a pre-determined RF output power compression level.

* * * * *